US007847577B2

(12) United States Patent
Yoshida et al.

(10) Patent No.: US 7,847,577 B2
(45) Date of Patent: Dec. 7, 2010

(54) ACTIVE MATRIX SUBSTRATE, DISPLAY DEVICE, AND ACTIVE MATRIX SUBSTRATE INSPECTING METHOD

(75) Inventors: Masahiro Yoshida, Mie (JP); Kazunori Tanimoto, Kyoto (JP); Yasuhiro Mimura, Nara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 119 days.

(21) Appl. No.: 12/376,045

(22) PCT Filed: Mar. 12, 2007

(86) PCT No.: PCT/JP2007/054799

§ 371 (c)(1),
(2), (4) Date: Feb. 2, 2009

(87) PCT Pub. No.: WO2008/015808

PCT Pub. Date: Feb. 7, 2008

(65) Prior Publication Data

US 2010/0006838 A1    Jan. 14, 2010

(30) Foreign Application Priority Data

Jul. 31, 2006    (JP)    ............................. 2006-208642

(51) Int. Cl.
*G01R 31/00*    (2006.01)
(52) U.S. Cl. .................................................... 324/770
(58) Field of Classification Search .............. 324/158.1, 324/770, 753; 345/51, 87, 99, 100; 349/54, 349/149
See application file for complete search history.

(56) References Cited

U.S. PATENT DOCUMENTS

| 7,486,100 B2* | 2/2009 | Sakaguchi et al. .......... 324/770 |
| 7,525,336 B2* | 4/2009 | Kim et al. .................... 324/770 |
| 2004/0046920 A1 | 3/2004 | Hayata et al. | |

FOREIGN PATENT DOCUMENTS

| JP | 08-262485 | 10/1996 |
| JP | 09-329796 | 12/1997 |
| JP | 2003-241217 | 8/2003 |
| JP | 2004-325956 | 11/2004 |
| JP | 2005-241988 | 9/2005 |

OTHER PUBLICATIONS

International Search Report for PCT/JP2007/054799, mailed Jun. 19, 2007.

* cited by examiner

*Primary Examiner*—Minh N Tang
*Assistant Examiner*—Trung Q Nguyen
(74) *Attorney, Agent, or Firm*—Nixon & Vanderhye, P.C.

(57) ABSTRACT

By feeding inspection signals independent from each other to upper first and second gate lead inspection lines (52*b*, 52*c*), respectively, while maintaining the upper gate-side switching elements (40*c*) in an ON state, any short circuit between adjacent gate lines (40) of upper gate lines (40) and the like can be detected. By feeding inspection signals independent from each other to lower first and second gate lead inspection lines (53*b*, 53*c*), respectively, while maintaining lower gate-side switching elements (40*c*') in an ON state, any short circuit between adjacent gate lines (40) of lower gate lines (40) and the like can be detected. By feeding inspection signals independent from each other to source lead inspection lines (55) while maintaining source-side switching elements (41) in an ON state, any short circuit between adjacent ones of source lines (41) and the like can be detected.

8 Claims, 5 Drawing Sheets

ACTIVE MATRIX SUBSTRATE, DISPLAY DEVICE, AND ACTIVE MATRIX SUBSTRATE INSPECTING METHOD

This application is the U.S. national phase of International Application No. PCT/JP2007/054799, filed 12 Mar. 2007, which designated the U.S. and claims priority to Japanese Patent Application No. 2006-208642, filed 31 Jul. 2006, the entire contents of each of which are hereby incorporated by reference.

TECHNICAL FIELD

The present invention relates to an active matrix substrate, a display device, and a method for inspecting an active matrix substrate. To go into more details, the present invention relates to the following: an active matrix substrate that includes a plurality of first lines formed in a display area, a plurality of second lines crossing the first lines and formed in the display area, and a plurality of terminals formed in a mounting area; a display device; and a method for inspecting an active matrix substrate.

BACKGROUND ART

A liquid crystal panel has an advantage in that it is thin and light, and consumes less electric power. Therefore, liquid crystal panels are used widely in, for example, portable terminal devices such as mobile telephones and PDAs, and electronic equipment such as personal computers, television sets, video cameras, and digital cameras.

FIG. 4 shows an example of a Chip On Glass (COG) type liquid crystal panel 100 that has been used conventionally. The liquid crystal panel 100 includes an active matrix substrate 101, and a counter substrate 102 opposed to the active matrix substrate 101. A liquid crystal layer (not shown) is interposed between the active matrix substrate 101 and the counter substrate 102.

The active matrix substrate 101 has a display area 103, a lead-out line area 104, and a mounting area 105. The display area 103 is an area in which gate lines 103a and source lines 103b are formed so as to cross each other orthogonally. Through the lead-out line area 104, the gate lines 103a and the source lines 103b are led out. The mounting area 105 is intended to mount, for example, a driving circuit (not shown). It should be noted that one edge of the liquid crystal panel 100 is referred to as a first edge 100a (the lower edge in FIG. 4), the edges thereof on the left and right sides with respect to the first edge 100a are referred to as a second edge 100b and a third edge 100c, respectively, and the edge thereof opposed to the first edge 100a is referred to as a fourth edge 100d.

In the mounting area 105, a plurality of gate terminals 105a and a plurality of source terminals 105b are formed. The plurality of gate terminals 105a and the plurality of source terminals 105b are formed in one area of the active matrix substrate 101 so as to narrow a frame part of the liquid crystal panel 100 (see JP 2003-241217 A, for example).

When the active matrix substrate 101 and the counter substrate 102 are aligned to each other, the mounting area 105 of the active matrix substrate 101 is positioned closer to the first edge 100a as compared with the counter substrate 102. Therefore, the second edge 100b of the active matrix substrate 101 has a length H longer than a length L of the second edge 100b of the counter substrate 102.

In the display area 103, the plurality of gate lines $103a_1$, $103a_2$, ... $103a_m$ are formed in a row direction (left-right direction in FIG. 4), and the plurality of source lines $103b_1$, $103b_2$, ... $103b_n$ are formed in a column direction (top-bottom direction in FIG. 4). Thin-film transistors (TFT) (not shown), and pixel electrodes (not shown) connected with the thin film transistors are formed at intersection portions between the gate lines 103a and the source lines 103b.

Upper gate lead-out lines 106 are connected with the gate lines 103 formed in an upper side (the fourth edge 100d side) part of the display area 103, as well as to the gate terminals 105a formed in the mounting area 105. The upper gate lead-out lines 106 are formed along the third edge 100c. Lower gate lead-out lines 107 are connected with the gate lines 103a formed in a lower side (the first edge 100a side) part of the display area 103, as well as to the gate terminals 105a formed in the mounting area 105. The lower gate lines 103a are formed along the second edge 100b. It should be noted that FIG. 5 shows a modification example of the liquid crystal panel 100 shown in FIG. 4, in which the plurality of gate lines $103a_1$, $103a_2$, ... $103a_m$ are lead out alternately to the second edge 100b side and to the third edge 100c side.

A line-break-inspection line 108 for the upper gate lines is connected with respective extension lines extended individually from the plurality of gate terminals 105a to which the upper gate lead-out lines 106 are connected. The line-break-inspection line 108 for the upper gate lines also are connected with an upper gate line inspection pad 109. Since the line-break inspection line 108 for the upper gate lines is connected with the upper gate line inspection pad 109, it is possible to feed a gate inspection signal from the upper gate line inspection pad 109 to the upper gate lines 103a via the upper gate lead-out lines 106 at once.

A line-break-inspection line 110 for the lower gate lines is connected with respective extension lines extended individually from the gate terminals 105a connected with the lower gate lead-out lines 107. Further, the line-break-inspection line 110 for the lower gate lines are connected with a lower gate line inspection pad 111. Since the line-break-inspection line 110 for the lower gate lines is connected with the lower gate line inspection pad 111, it is possible to feed a gate inspection signal from the lower gate line inspection pad 111 to the lower gate lines 103a via the lower gate lead-out lines 107 at once.

Source lead-out lines 112 are connected with the source lines 103b formed in the display area 103, and with the source terminals 105 formed in the mounting area 105. Source-side switching elements 113 are connected with the source lines 103b. Source lead inspection lines 114 are connected with the source-side switching elements 113 and source line inspection pads 115. The source lead inspection lines 114 are formed along the third edge 100c and the fourth edge 100d.

The source line inspection pads 115 includes a switching pad 115a fed with a control signal for turning on/off of the source-side switching elements 113, an inspection pad 115b fed with a source inspection signal to be fed to the odd-numbered source lines $103b_1$, $103b_3$, ... $103b_{n-1}$, and an inspection pad 115c fed with a source inspection signal to be fed to the even-numbered source lines $103b_2$, $103b_4$, ... $103b_n$. This configuration allows different source inspection signals to be fed to adjacent source lines (for example, the source line $103b_1$ and the source line $103b_2$), respectively.

A common inspection line 116 positioned on the second edge 100b side part of the lead-out line area 104 is connected with a common electrode pad 117. Further, the common inspection line 116 also is connected with a common line 118 formed so as to surround the display area 103. The common line 118 has transfer pads 118a, The transfer pads 118a are connected with a common electrode (not shown) formed on the counter substrate 102. This allows a common voltage to be applied from the common electrode pad 117 to the common electrode formed on the counter substrate 102.

In the liquid crystal panel 100 as described above, an electrical connection state of the active matrix substrate 101 is inspected before a driving circuit is mounted on the mounting area 105 (see JP 2004-325956 A and JP 2005-241988 A, for example). As a method for inspection, the following method is used: probes for inspection (not shown), for example, are brought into contact with the upper gate line inspection pad 109, the lower gate line inspection pad 111, the source line inspection pads 115, and the common electrode pad 117, so that a gate inspection signal is fed to the gate lines 103a while a source inspection signal is fed to the source lines 103b. With this, the orientation directions of liquid crystal molecules are controlled, and, for example, when the liquid crystal panel 100 is irradiated from the back side with an illumination means such as a backlight, the display area 103 of the liquid crystal panel 100 displays an image. Therefore, an electrical connection state of the active matrix substrate 101 can be inspected by, for example, an inspector's visual observation, on the display area 103 of the liquid crystal panel 100.

For example, a gate inspection signal is fed from the upper gate line inspection pad 109 to the upper gate lines 103a and the upper gate lead-out lines 106. A gate inspection signal is fed from the lower gate line inspection pad 111 to the lower gate lines 103a and the lower gate lead-out lines 107. This allows any break in the gate lines 103a and the gate lead-out lines 106 and 107 to be detected on the display area 103 of the liquid crystal panel 100.

Further, the source inspection signals are fed from the source line inspection pads 115 to the source lines 103b and the source lead-out lines 112. This allows any break in the source lines 103b to be detected on the display area 103 of the liquid crystal panel 100. Further, to adjacent ones of the source lines 103b, different source inspection signals are fed from the source line inspection pads 115. This allows any short circuit (leak) of the source lines 103b and the source lead-out lines 112 to be detected on the display area 103 of the liquid crystal panel 100.

DISCLOSURE OF INVENTION

Problem to be Solved by the Invention

In the active matrix substrate in the above-described liquid crystal panel, however, a gate inspection signal is fed from the upper gate line inspection pad to the upper gate lines and the upper gate lead-out lines at once. Likewise, a gate inspection signal is fed from the lower gate line inspection pad to the lower gate lines and the lower gate lead-out lines at once. In other words, to adjacent ones of the gate lines, the same gate inspection signal is fed. Therefore, there arises a problem in that in the above-described active matrix substrate, a short circuit (leak) of the gate lines and the gate lead-out lines cannot be detected.

In the above-described active matrix substrate, in particular, the plurality of gate terminals and the plurality of source terminals are formed collectively in one area on the active matrix substrate, so as to narrow the frame part of the liquid crystal panel. Therefore, the gate terminals on the mounting area are disposed at narrow intervals, and so are the source terminals. This also results in narrow intervals between the gate lead-out lines and narrow intervals between the source lead-out lines. Consequently, a short circuit tends to occur between the gate lead-out lines and between the source lead-out lines.

The present invention was made in light of the above-described problem, and it is an object of the present invention to provide an active matrix substrate having a simple configuration that allows a short circuit of lines on the active matrix substrate to be detected surely and allows inspection errors to decrease, a display device having such an active matrix substrate, and a method for inspecting such an active matrix substrate.

Means to Solve by the Problem

To achieve the above-described object, an active matrix substrate according to the present invention includes: a plurality of first lines formed parallel with one another in a display area; a plurality of second lines formed parallel with one another so as to cross the first lines in the display area; and a plurality of terminals formed in a mounting area, wherein the plurality of first lines, having first ends on one side and second ends on the other side, include a first group of the first lines that are adjacent to one another and whose first ends serve as input ends for a driving signal, and a second group of the first lines that are adjacent to one another and whose second ends serve as input ends for a driving signal. The active matrix substrate further includes: a first lead-out line that connects the first ends of the first lines of the first group with the terminals; a second lead-out line that connects the second ends of the first lines of the second group with the terminals; first switching elements connected with the second ends of the first lines of the first group; second switching elements connected with the first ends of the first lines of the second group; a third lead-out line that connects the first ends of the second lines with the terminals; third switching elements connected with the second lines or the third lead-out line; a first switching element control line through which an ON/OFF control signal can be fed to the first switching elements; a second switching element control line through which an ON/OFF control signal can be fed to the second switching elements; and a third switching element control line through which an ON/OFF control signal can be fed to the third switching elements; a first inspection line through which an inspection signal can be fed to the first switching elements that are not adjacent to one another, among the first switching elements connected with the first lines of the first group; a second inspection line connected with the first switching elements that are not connected with the first inspection line and are not adjacent to one another among the first switching elements connected with the first lines of the first group, so that an inspection signal can be fed to said first switching elements; a third inspection line through which an inspection signal can be fed to the second switching elements that are not adjacent to one another, among the second switching elements connected with the first lines of the second group; a fourth inspection line connected with the second switching elements that are not connected with the third inspection line and are not adjacent to one another, among the second switching elements connected with the first lines of the second group, so that an inspection signal can be fed to said second switching elements; a fifth inspection line through which an inspection signal can be fed to the third switching elements that are not adjacent to one another, among the third switching elements connected with the second lines; and a sixth inspection line connected with the third switching elements that are not connected with the fifth inspection line and are not adjacent to one another, among the third switching elements connected with the second lines, so that an inspection signal can be fed to said third switching elements.

To achieve the above-described object, a display device according to the present invention includes the above-described active matrix substrate of the present invention.

To achieve the above-described object, an active matrix substrate inspecting method according to the present invention is a method for inspecting the above-described active matrix substrate, and the method includes the steps of: inspecting the first lines of the first group by feeding an inspection signal thereto through the first line-break-inspection line; inspecting the first lines of the second group by feeding an inspection signal thereto through the second line-break-inspection line; cutting the first extension lines and the second extension lines; inspecting the first lines of the first group and the first lead-out line by feeding inspection signals independent from each other to the first inspection line and the second inspection line, respectively, while maintaining the first switching elements in an ON state; inspecting the first lines of the second group and the second lead-out line by feeding inspection signals independent from each other to the third inspection line and the fourth inspection line, respectively, while maintaining the second switching elements in an ON state; and inspecting the second lines by feeding inspection signals independent from each other to the fifth inspection line and the sixth inspection line, respectively, while maintaining the third switching elements in an ON state.

EFFECTS OF THE INVENTION

As described above, the active matrix substrate, the display device, and the method for inspecting the active matrix substrate according to the present invention exhibit an effect such that with a simple configuration, any short circuit in lines on the active matrix substrate can be detected surely, and inspection errors decrease.

DESCRIPTION OF THE INVENTION

Figure 1:
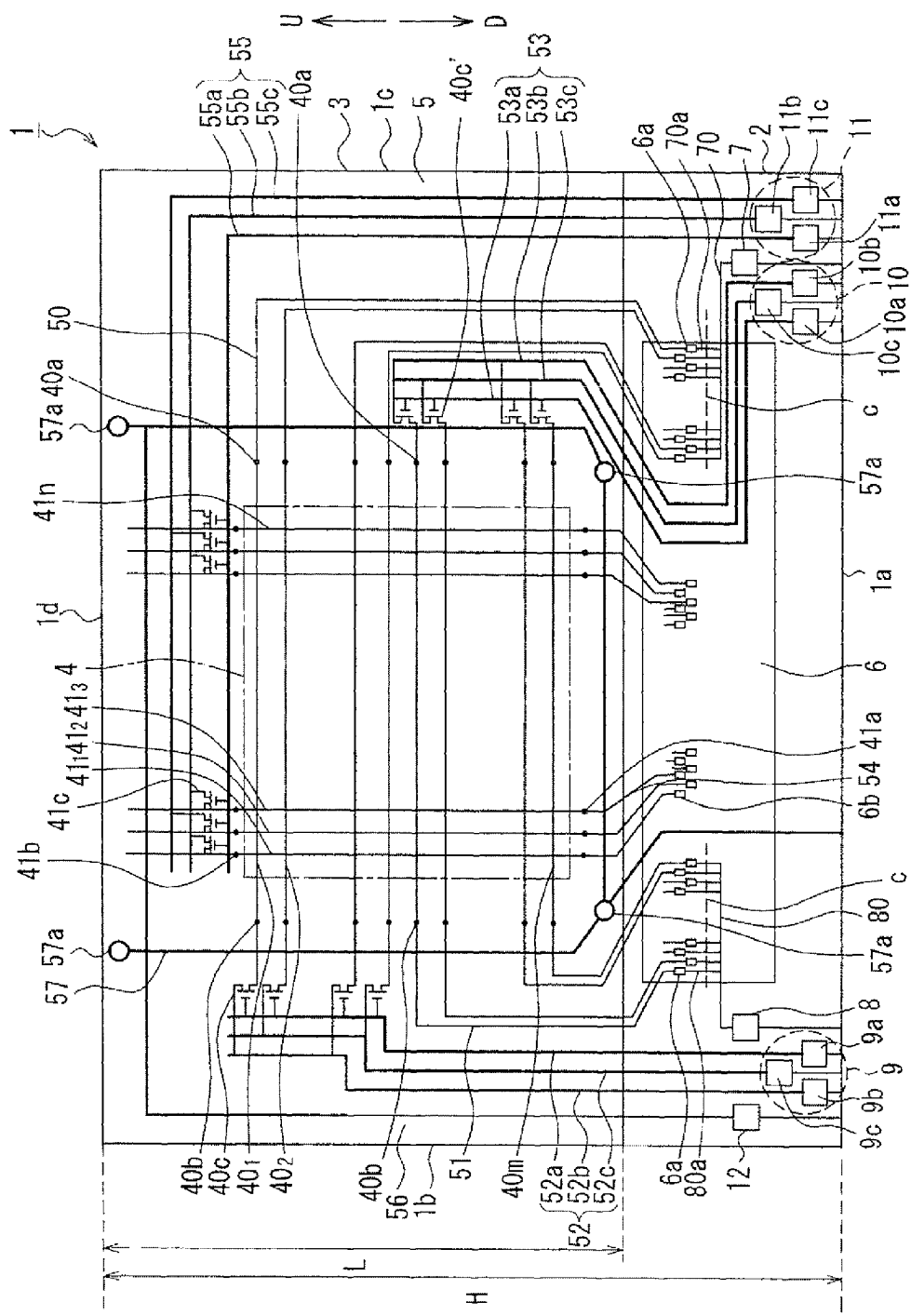
FIG. 1 is a plan view showing a liquid crystal panel according to an embodiment of the present invention.

To achieve the above-described object, an active matrix substrate according to the present invention includes: a plurality of first lines formed parallel with one another in a display area; a plurality of second lines formed parallel with one another so as to cross the first lines in the display area; and a plurality of terminals formed in a mounting area, wherein the plurality of first lines, having first ends on one side and second ends on the other side, include a first group of the first lines that are adjacent to one another and whose first ends serve as input ends for a driving signal, and a second group of the first lines that are adjacent to one another and whose second ends serve as input ends for a driving signal. The active matrix substrate further includes a first lead-out line that connects the first ends of the first lines of the first group with the terminals; a second lead-out line that connects the second ends of the first lines of the second group with the terminals; first switching elements connected with the second ends of the first lines of the first group; second switching elements connected with the first ends of the first lines of the second group; a third lead-out line that connects the first ends of the second lines with the terminals; third switching elements connected with the second lines or the third lead-out line; a first switching element control line through which an ON/OFF control signal can be fed to the first switching elements; a second switching element control line through which an ON/OFF control signal can be fed to the second switching elements; and a third switching element control line through which an ON/OFF control signal can be fed to the third switching elements; a first inspection line through which an inspection signal can be fed to the first switching elements that are not adjacent to one another, among the first switching elements connected with the first lines of the first group; a second inspection line connected with the first switching elements that are not connected with the first inspection line and are not adjacent to one another, among the first switching elements connected with the first lines of the first group, so that an inspection signal can be fed to the first switching elements connected with the second inspection line; a third inspection line through which an inspection signal can be fed to the second switching elements that are not adjacent to one another, among the second switching elements connected with the first lines of the second group; a fourth inspection line connected with the second switching elements that are not connected with the third inspection line and are not adjacent to one another, among the second switching elements connected with the first lines of the second group, so that an inspection signal can be fed to the second switching elements connected with the fourth inspection line; a fifth inspection line through which an inspection signal can be fed to the third switching elements that are not adjacent to one another, among the third switching elements connected with the second lines; and a sixth inspection line connected with the third switching elements that are not connected with the fifth inspection line and are not adjacent to one another, among the third switching elements connected with the second lines, so that an inspection signal can be fed to the third switching elements connected with the sixth inspection line.

According to the active matrix substrate of the present invention, in an inspection step in the manufacturing process or the like, an inspection signal can be fed to the first lines of the first group and the first lead-out line via the first switching elements, by maintaining the first switching elements in an ON state (conductive state) with use of ON/OFF control signal while feeding independent inspection signals to the first inspection line and the second inspection line, respectively. It should be noted that the first inspection line allows an inspection signal to be fed to, among the first switching elements connected with the first lines of the first group, those which are not adjacent to one another. Further, the second inspection line is connected with, among the first switching elements connected with the first lines of the first group, those which are not connected with the first inspection line and are not adjacent to one another, and hence, allows an inspection signal to be fed to the first switching elements. Therefore, gate inspection signals independent from each other can be fed to adjacent ones of the first lines in the first group and adjacent ones of the first lead-out line. Thereby any short circuit (leak) between adjacent ones of the first lines in the first group and any short circuit between adjacent ones of the first lead-out line can be detected. In the same manner, inspection signals that are independent from each other may be fed to the third inspection line and the fourth inspection line, respectively, while the second switching elements are maintained in an ON state (conductive state) by using an ON/OFF control signal.

Thereby any short circuit between adjacent ones of the first lines in the second group and any short circuit between adjacent ones of the second lead-out line can be detected. Further, in the same manner as described above, source inspection signals that are independent from each other may be fed to the fifth inspection line and the sixth inspection line, respectively, while the third switching elements are maintained in an ON state (conductive state) with use of an ON/OFF control signal. Thereby any short circuit between adjacent ones of the second lines and any short circuit between adjacent ones of the third lead-out line can be detected. Consequently, it is possible to achieve an active matrix substrate having a simple configuration that allows a short circuit in lines to be detected surely and allows inspection errors to decrease.

To achieve the above-described object, the active matrix substrate according to the present invention preferably is configured so that the first lines of the first group are provided farther to the mounting area, as compared with the first lines of the second group, and the second switching element control line, the third inspection line, and the fourth inspection line are provided closer to the display area, as compared with the first lead-out line.

In this configuration, the first lines of the first group are arranged farther to the mounting area, as compared with the first lines of the second group. Therefore, since the second switching element control line, the third inspection line, and the fourth inspection line are formed on the display area side, as compared with the first lead-out line of the first group, they do not intersect the first lead-out line. On the other hand, if, contrary to the above-described configuration, the first lead-out line are formed on the display area side, as compared with the second switching element control line, the third inspection line, and the fourth inspection line, the first lead-out line would intersect the second switching element control line, the third inspection line, and the fourth inspection line. Then, electric capacities would be generated at the intersection portion. According to the above-described configuration of the present invention, in which the second switching element control line, the third inspection line, and the fourth inspection line are formed on the display area side, as compared with the first lead-out line, so as not to intersect the first lead-out line, any delay is not increased in a signal fed to the first lines of the first group via the first lead-out line. In other words, a so-called block division problem owing to a difference in potentials achieved between the first lines of the first group and the first lines of the second group in the display area does not occur.

To achieve the above-described object, the active matrix substrate of the present invention preferably is configured so as to further include: first extension lines that are extended individually from the plurality of terminals connected with the first lead-out line; a first line-break-inspection line to which each of the first extension lines is connected and through which an inspection signal can be fed; second extension lines that are extended individually from the plurality of terminals connected with the second lead-out line; and a second line-break-inspection line to which each of the second extension lines is connected and through which an inspection signal can be fed.

According to the foregoing configuration an inspection signal can be fed from the first line-break-inspection line via the first extension lines and the terminals to the first lead-out line and the first lines of the first group. Besides, an inspection signal can be fed from the second line-break-inspection line via the second extension lines and the terminals to the second lead-out line and the first lines of the second group. Incidentally, if lines of the active matrix substrate are charged with static electricity, discharge can possibly occurs, which might lead to short circuits or line breaks, at positions where the foregoing lines intersect other lines with an insulation film being interposed, and the like In contrast, in the foregoing configuration, since the first and second extension lines extended individually from the plurality of terminals are connected with the first and second line-break-inspection lines, static electricity generated in the active matrix substrate can be removed via the first line-break-inspection line and the second line-break-inspection line. Therefore, it can be possible to suppress the occurrence of defects in the active matrix substrate due to static electricity. Consequently, the yield of the active matrix substrate can be improved.

To achieve the above-described object, the active matrix substrate according to the present invention preferably is configured so that the third switching elements are connected with the third lead-out line.

According to the foregoing configuration, an inspection signal is fed from the fifth inspection line and the sixth inspection line via the third lead-out line to the second lines. Therefore, not only any break in the second lines, but also any break in the third lead-out line can be detected. As a result, an active matrix substrate that allows inspection errors to decrease can be achieved.

To achieve the above-described object, the active matrix substrate of the present invention preferably is configured so that the first lines are gate lines, and the second lines are source lines.

According to the foregoing configuration, the first to fourth inspection lines function as gate lines, and the fifth and sixth inspection lines function as source lines. This allows any break or short circuit in the lines on the active matrix substrate to be detected on the display area of the active matrix substrate.

To achieve the above-described object, a display device according to the present invention includes the above-described active matrix substrate according to the present invention. It should be noted that the display device is, for example, a liquid crystal display device. Therefore, since the display device of the present invention includes the active matrix substrate that allows any short circuit in the lines on the active matrix substrate to be detected surely and allows inspection errors to decrease, the yield of the display device can be improved.

To achieve the above-described object, a method according to the present invention for inspecting an active matrix substrate is a method for inspecting electric connection states in the above-described active matrix substrate according to the present invention, and the method includes the steps of: inspecting the first lines of the first group by feeding an inspection signal thereto through the first line-break-inspection line; inspecting the first lines of the second group by feeding an inspection signal thereto through the second line-break-inspection line; cutting the first extension lines and the second extension lines; inspecting the first lines of the first group and the first lead-out line by feeding inspection signals independent from each other to the first inspection line and the second inspection line, respectively, while maintaining the first switching elements in an ON state; inspecting the first lines of the second group and the second lead-out line by feeding inspection signals independent from each other to the third inspection line and the fourth inspection line, respectively, while maintaining the second switching elements in an ON state; and inspecting the second lines by feeding inspection signals independent from each other to the fifth inspection line and the sixth inspection line, respectively, while maintaining the third switching elements in an ON state.

According to the method for inspecting of the active matrix substrate according to the present invention, any break in the first lines can be detected by feeding inspection signals via the first line-break-inspection line and the second line-break-inspection line, respectively. Then, in the cutting step, by cutting the first extension lines and the second extension lines, the terminals connected electrically by the first line-break-inspection line and the second line-break-inspection line are cut from one another electrically. Thereafter, the step of inspecting the first lines of the first group is performed by feeding inspection signals independent from each other to the first inspection line and the second inspection line, respectively, while maintaining the first switching elements in an ON state, and the step of inspecting the first lines of the second group is performed in the same manner. Thereby at least any short circuit of the first lines of the first and second groups, the first lead-out line, and the second lead-out line can be detected. As a result, a line break or a short circuit in lines on the active matrix substrate can be detected surely by a simple method of inspection. Thus, the method for inspecting an active matrix substrate, which allows inspection errors to decrease, can be achieved. It should be noted that the step of inspecting the second lines may be performed prior to, or after, the cutting step.

The following describes an embodiment of the present invention while referring to the drawings. It should be noted that for convenience of explanation, the drawings referred to herein are simplified drawings showing exclusively principal members necessary for explaining the present invention, among constituent members of the embodiment of the present invention. A liquid crystal panel according to the present invention (an active matrix substrate in the liquid crystal panel in particular) therefore possibly includes arbitrary constitutional members now shown in the drawings referred to in the present specification. Besides, dimensions of the members shown in the drawings do not faithfully represent the actual dimensions of the constitutional members and the actual dimension ratios of the members.

A liquid crystal panel 1 according to the present embodiment includes an active matrix substrate 2 and a counter substrate 3 opposed to the active matrix substrate 2, as shown in FIG. 1. A liquid crystal layer (not shown) is interposed between the active matrix substrate 2 and the counter substrate 3. It should be noted that the liquid crystal panel 1 according to the present embodiment can be used widely in liquid crystal devices, such as portable liquid crystal devices such as mobile telephones and PDAs, liquid crystal devices for game machines, and liquid crystal devices for use in car navigation systems, personal computers, television sets, video cameras, and digital cameras. Further, the active matrix substrate 2 according to the present embodiment may be provided in a display device other than the liquid crystal display device, such as a CRT (cathode ray tube) display, a plasma display, or an organic EL display.

The active matrix substrate 2 has a display area 4, a lead-out line area 5, and a mounting area 6. The display area 4 is an area in which gate lines (first lines, second lines) 40 and source lines (second lines, first lines) 41 are formed so as to cross each other. Through the lead-out line area 5, the gate lines 40 and the source lines 41 are lead out. The mounting area 6 is intended to mount, for example, a driving circuit (not shown). It should be noted that one edge of the liquid crystal panel 1 is referred to as a first edge 1a (the lower edge in FIG. 1), edges on the left and right sides with respect to the first edge 1a are referred to as a second edge 1b and a third edge 1c, respectively, and the edge opposed to the first edge 1a is referred to as a fourth edge 1d.

When the active matrix substrate 2 and the counter substrate 3 are applied to each other, the mounting area 6 of the active matrix substrate 2 is positioned closer to the first edge 1a as compared with the counter substrate 3. Therefore, the second edge 1b of the active matrix substrate 2 has a length H longer than a length L of the second edge 1b of the counter substrate 2.

In the mounting area 6, a plurality of gate terminals 6a and a plurality of source terminals 6b are formed. The mounting area 6 is an area on which a driving circuit is mounted by the COG (Chip On Glass) method. The mounting area 6, however, may be an area on which either a driving circuit or a flexible circuit board on which a driving circuit is mounted is mounted by the foregoing COG method or a method other than the foregoing COG method, such as the TCP (Tape Carrier Package) method, or the COF (Chip On Film) method.

The display area 4 has a plurality of gate lines $40_1$, $40_2, \ldots 40_m$ that are formed parallel with one another in a row direction (left-right direction in FIG. 1) and to which a driving signal is fed, and a plurality of source lines $41_1, 41_2, \ldots 41_n$, that are formed parallel with one another in a column direction (top-bottom direction in FIG. 1) and to which pixel data are fed. In other words, the gate lines 40 and the source lines 41 are formed so as to cross each other orthogonally. Thin film transistors (TFT) and metal insulator metals (MIM) (not shown) and pixel electrodes (not shown) connected with the TFTs and MIMs are formed at intersection portions between the gate lines 40 and the source lines 41.

The following first describes a configuration in which the gate lines 40 are led out through the lead-out line area 5.

It should be noted that the gate lines 40 formed in an upper side (the fourth edge 1d side) part of the display area 4 are referred to as upper gate lines (first group) 40; and the gate lines 40 formed in a lower side (the first edge 1a side) part of the display area 4 are referred to as lower gate lines (second group) 40. In the present embodiment, the upper side of the display area 4 is a side indicated by an arrow U in FIG. 1. The lower side of the display area 4 is a side indicated by an arrow D in FIG. 1. The upper and lower sides of the display area 4, however, are not limited to these.

Upper gate lead-out lines (first lead-out lines) 50 are connected with ends 40a on one side (hereinafter referred to as first ends 40a) of the upper gate lines 40, and with gate terminals 6a formed on the mounting area 6. The upper gate lead-out lines 50 are formed along the third edge 1c and the fourth edge 1d. It should be noted that the first ends 40a of the upper gate lines 40 are input ends through which a driving signal is fed.

Lower gate lead-out lines (second lead-out lines) 51 are connected with ends 40b on the other side (hereinafter referred to as second ends 40b) of the lower gate lines 40 and gate terminals 6a formed in the mounting area 6. The lower gate lead-out lines 51 are formed along the second edge 1b and the fourth edge 1d. It should be noted that the second ends 40b of the lower gate lines 40 are input ends through which a driving signal is fed. Further, the number of the upper gate lead-out lines 50 and the number of the lower gate lead-out lines 51 may be the same, or may be different.

A line-break-inspection line first line-break-inspection line) 70 for the upper gate lines is connected with first extension lines 70a that are extended individually from the plurality of gate terminals 6a connected with the upper gate lead-out lines 50. The line-break-inspection line 70 for the upper gate lines also is connected with an upper gate line inspection pad 7 for first inspection. It should be noted that preferably the line-break-inspection line 70 for the upper gate lines is connected with each of the first extension lines 70a extended individually from the plurality of gate terminals 6a. The reason is as follows. If lines of the active matrix substrate 2 are charged with static electricity, discharge can possibly occurs, which might lead to short circuits or line breaks, at positions where lines charged with static electricity and other lines intersect each other with an insulation film being interposed. Besides, the discharge could possibly cause changes in properties of TFTs and MIMs disposed at the intersection portions of the gate lines 40 and the source lines 41 in some cases. Therefore, in the case where the line-break-inspection line 70 for the upper gate lines is connected with each of the first extension lines 70a, static electricity generated in the active matrix substrate 2 can be removed via the line-break-inspection line 70 for the upper gate lines. Besides, in the case where the line-break-inspection line 70 for the upper gate lines is connected with each of the first extension lines 70a, it is possible to feed a gate inspection signal to the upper gate lines 40 and the upper gate lead-out lines 50 at once via the upper gate line inspection pad 7 for the first inspection.

A line-break-inspection line (second line-break-inspection line) 80 for the lower gate lines is connected with second extension lines 80a extended individually from a plurality of gate terminals 6a connected with the lower gate lead-out lines 51. The line-break-inspection line 80 for the lower gate lines also is connected with a lower gate line inspection pad 8 for first inspection. It should be noted that preferably the line-break-inspection line 80 for the lower gate lines is connected with each of the second extension lines 80a extended individually from the plurality of gate terminals 6a, for the same reason as the above-described reason with regard to the line-break-inspection line 70 for the upper gate lines.

Upper gate lead inspection lines 52 include an upper gate-side switching element control line 52a, an upper first gate lead inspection line 52b, and an upper second gate lead inspection line 52c.

The upper gate-side switching element control line (first switching element control line) 52a is connected with upper gate-side switching elements (first switching elements) 40c. It should be noted that the upper gate-side switching elements 40c are connected with the second ends 40b of the upper gate lines 40. The upper gate-side switching element control line 52a is connected with a switching pad 9a of upper gate line inspection pads 9 for second inspection. The upper gate-side switching element control line 52a is a control line through which an ON/OFF control signal can be fed to the upper gate-side switching elements 40c.

The upper first gate lead inspection line (first inspection line) 52b is connected with the upper gate-side switching elements 40c. The upper first gate lead inspection line 52b is connected with an inspection pad 9b in the upper gate line inspection pads 9 for the second inspection. The upper first gate lead inspection line 52b is connected with, among the upper gate-side switching elements 40c, those which are not adjacent to one another. The upper first gate lead inspection line 52b is an inspection line through which a gate inspection signal can be fed to the above-described upper gate-side switching elements 40c.

The upper second gate lead inspection line (second inspection line) 52c is connected with the upper gate-side switching elements 40c. The upper second gate lead inspection line 52c is connected with an inspection pad 9c in the upper gate inspection pads 9 for the second inspection. The upper second gate lead inspection line 52c is connected with, among the upper gate-side switching elements 40c, those which are not connected with the upper first gate lead inspection line 52b and are not adjacent to one another. The upper gate lead inspection line 52c is an inspection line through which a gate inspection signal can be fed to the above-described upper gate-side switching elements 40c.

Here, the upper gate line inspection pads 9 for the second inspection include the switching pad 9a through which a control signal for turning on/off the upper gate-side switching elements 40c is fed, the inspection pad 9b through which a gate inspection signal is fed to odd-numbered upper gate lines $40_1, 40_3, \ldots$, and the inspection pad 9c through a gate inspection signal is fed to even-numbered upper gate lines $40_2, 40_4, \ldots$. Thus, different gate inspection signals can be fed to the adjacent upper gate lines 40 (for example, the gate line $40_1$ and the gate line $40_2$), respectively.

Lower gate lead inspection lines 53 include a lower gate-side switching element control line 53a, a lower first gate lead inspection line 53b, and a lower second gate lead inspection line 53c.

The lower gate-side switching element control line (second switching element control line) 53a is connected with lower gate-side switching elements (second switching elements) 40c'. It should be noted that the lower gate-side switching elements 40c are connected with the first ends 40a of the lower gate lines 40. The lower gate-side switching element control line 53a is connected with a switching pad 10a in lower gate line inspection pads 10 for the second inspection. The lower gate-side switching element control line 53a is a control line through which an ON/OFF control signal can be fed to the lower gate-side switching elements 40c'.

The lower first gate lead inspection line (third inspection line) 53b is connected with the lower gate-side switching elements 40c'. Further, the lower first gate lead inspection line 53b is connected with the inspection pad 10b in the lower gate line inspection pads 10 for the second inspection. The lower first gate lead inspection line 53b is connected with, among the lower gate-side switching elements 40c', those which are not adjacent to one another. The lower first gate lead inspection line 53b is an inspection line through which a gate inspection signal can be fed to the above-described lower gate-side switching elements 40c'.

The lower second gate lead inspection line (fourth inspection line) 53c is connected with the lower gate-side switching elements 40c'. Further, the lower second gate lead inspection line 53c is connected with the inspection pad 10c in the lower gate line inspection pads 10 for the second inspection. The lower second gate lead inspection line 53c is connected with, among the lower gate-side switching elements 40c', those which are not connected with the lower first gate lead inspection line 53b and are not adjacent to one another. The lower gate lead inspection line 53b is an inspection line through which a gate inspection signal can be fed to the above-described lower gate-side switching elements 40c'.

Here, the lower gate line inspection pads 10 for the second inspection include the switching pad 10a through which a control signal for turning on/off the lower gate-side switching elements 40c' is fed, the inspection pad 10b through which a gate inspection signal is fed to odd-numbered lower gate lines $40_{m-1}, 40_{m-3}, \ldots$, and the inspection pad 10c through a gate inspection signal is fed to even-numbered lower gate lines $40_m, 40_{m-2}, \ldots$. Thus, different gate inspection signals can be fed to the adjacent lower gate lines 40 (for example, the gate line $40_m$ and the gate line $40_{m-1}$), respectively.

Figure 2:
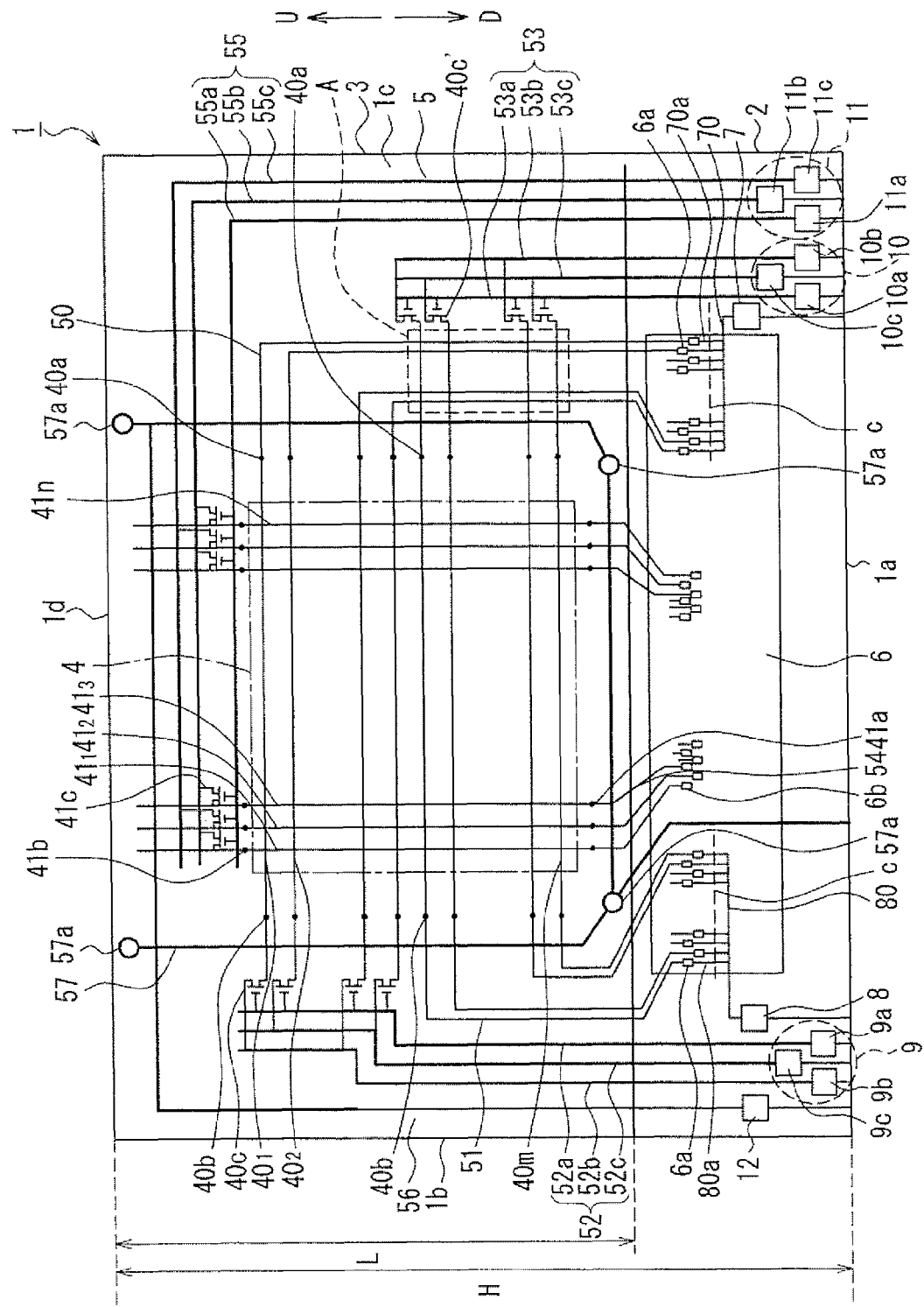
FIG. 2 is a plan view showing another liquid crystal panel according to an embodiment of the present invention.

It should be noted that the lower gate lead inspection lines 53 preferably are formed on the display area 4 side with respect to the upper gate lead-out lines 50. The reason for this is as follows. As shown in FIG. 2, if the upper gate lead-out lines 50 are formed on the display area 4 side with respect to the lower gate lead inspection lines 53, the upper gate lead-out lines 50 and the lower gate lead inspection lines 53 intersect each other in an intersection portion A. In contrast, as shown in FIG. 1, if the lower gate lead inspection lines 53 are formed on the display area 4 side with respect to the upper gate lead-out lines 50, the upper gate lead-out lines 50 and the lower gate lead inspection lines 53 do not intersect each other. Therefore, no electric capacity is generated at intersections between the upper gate lead-out lines 50 and the lower gate lead inspection lines 53. Thus, any delay is not increased in a signal fed to the upper gate lines 40 in the display area 4. In other words, a so-called block division problem owing to a difference in potentials achieved between the upper part and the lower part of the display area 4 does not occur.

Next, a configuration in which the source lines 41 are lead out to the lead-out line area 5 is described below.

Source lead-out lines (third lead-out lines) 54 are connected with ends 41a on one side (hereinafter referred to as first ends 41a) of the source lines 41 formed in the display area 4, and with the source terminals 6b formed in the mounting area 6.

Source lead inspection lines 55 include a source-side switching element control line 55a, a first source lead inspection line 55b, and a second source lead inspection line 55c.

The source-side switching element control line (third switching element control line) 55a is connected with source-side switching elements (third switching elements) 41c. It should be noted that the source-side switching elements 41c are connected with ends 41b on the other side (hereinafter referred to as second ends 41b) of the source lines 41. Further, the source-side switching element control line 55a also is connected with a switching pad 11a in the source line inspection pads 11. The source-side switching element control line 55a is a control line through which an ON/OFF control signal can be fed to the source-side switching elements 41c.

The first source lead inspection line (fifth inspection line) 55b is connected with the source-side switching elements 41c. The first source lead inspection line 55b is connected with an inspection pad 11b in the source line inspection pads 11. The first source lead inspection line 55b is connected with, among the source-side switching elements 41c, those which are not adjacent to one another. The first source lead inspection line 55b is an inspection line through which a source inspection signal can be fed to the above-described source-side switching elements 41c.

The second source lead inspection line (sixth inspection line) 55c is connected with the source-side switching elements 41c. The second source lead inspection line 55c also is connected with an inspection pad 11c in the source line inspection pads 11. The second source lead inspection line 55c is connected with, among the source-side switching elements 41c, those which are not connected with the first source lead inspection line 55b and are not adjacent with one another. The second source lead inspection line 55c is an inspection line through which a source inspection signal can be fed to the above-described source-side switching elements 41c.

Here, the source line inspection pads 11 include the switching pad 11a through which a control signal for turning on/off the source-side switching elements 41c is fed, the inspection pad 11b through which a source inspection signal is fed to odd-numbered source lines $41_1, 41_3, \ldots, 41_{n-1}$, and the inspection pad 11c through which a source inspection signal is fed to even-numbered source lines $41_2, 41_4, \ldots, 41_n$. This configuration allows different source inspection signals to be fed to the adjacent source lines 41 (for example, the source line $41_1$ and the source line $41_2$), respectively.

Figure 3:
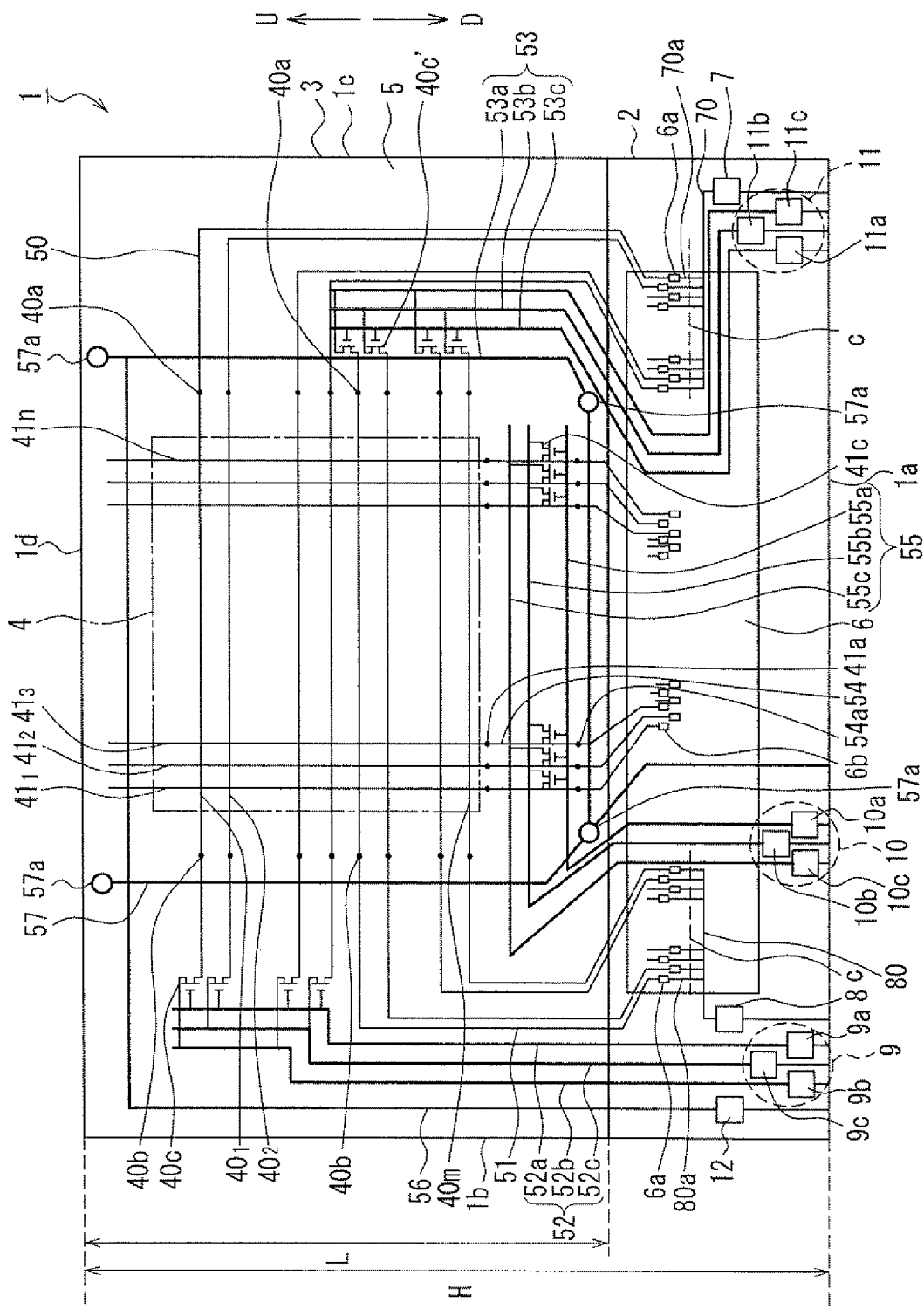
FIG. 3 is a plan view showing still another liquid crystal panel according to an embodiment of the present invention.
Figure 4:
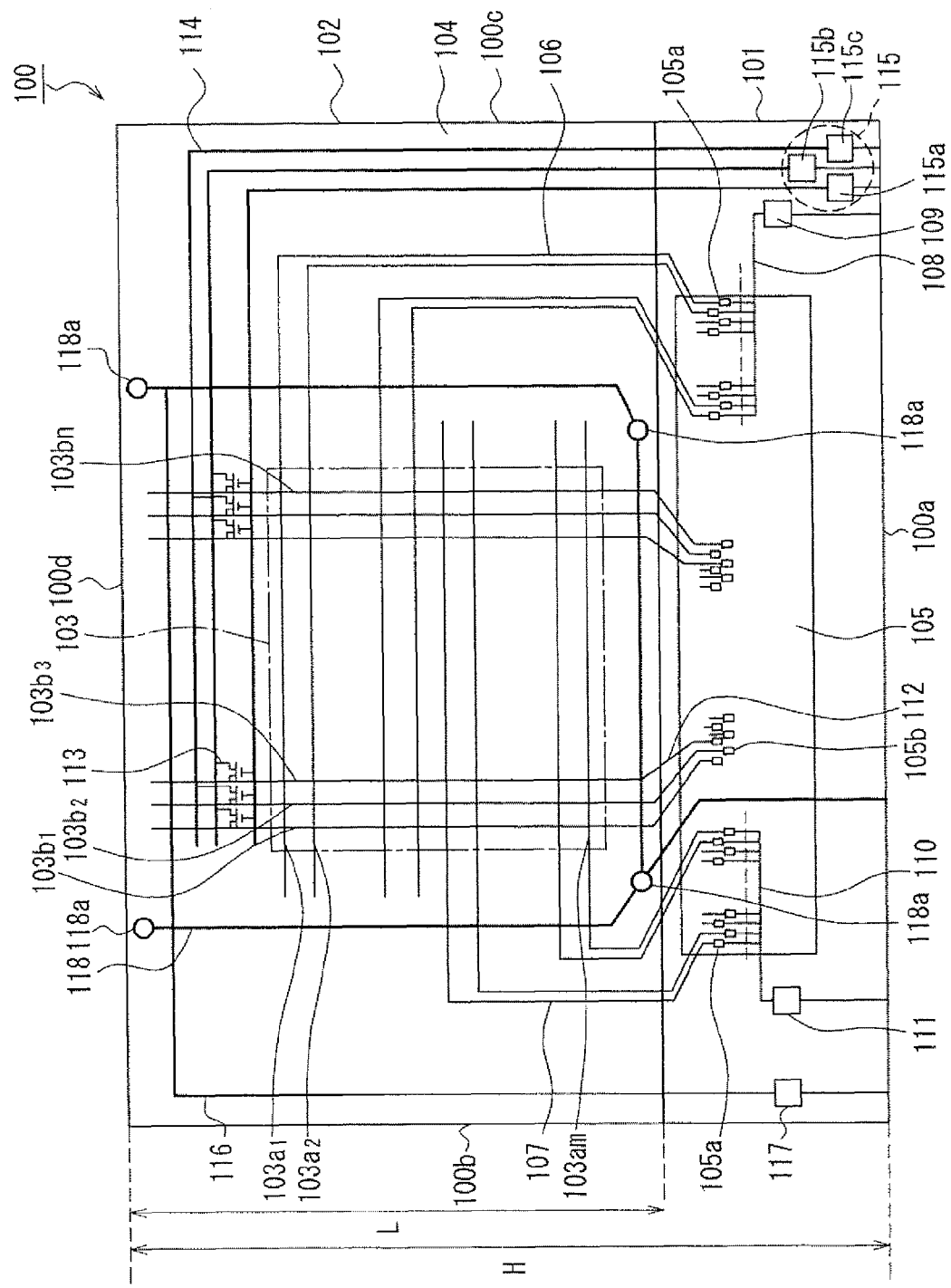
FIG. 4 is a plan view showing a conventional liquid crystal panel.
Figure 5:
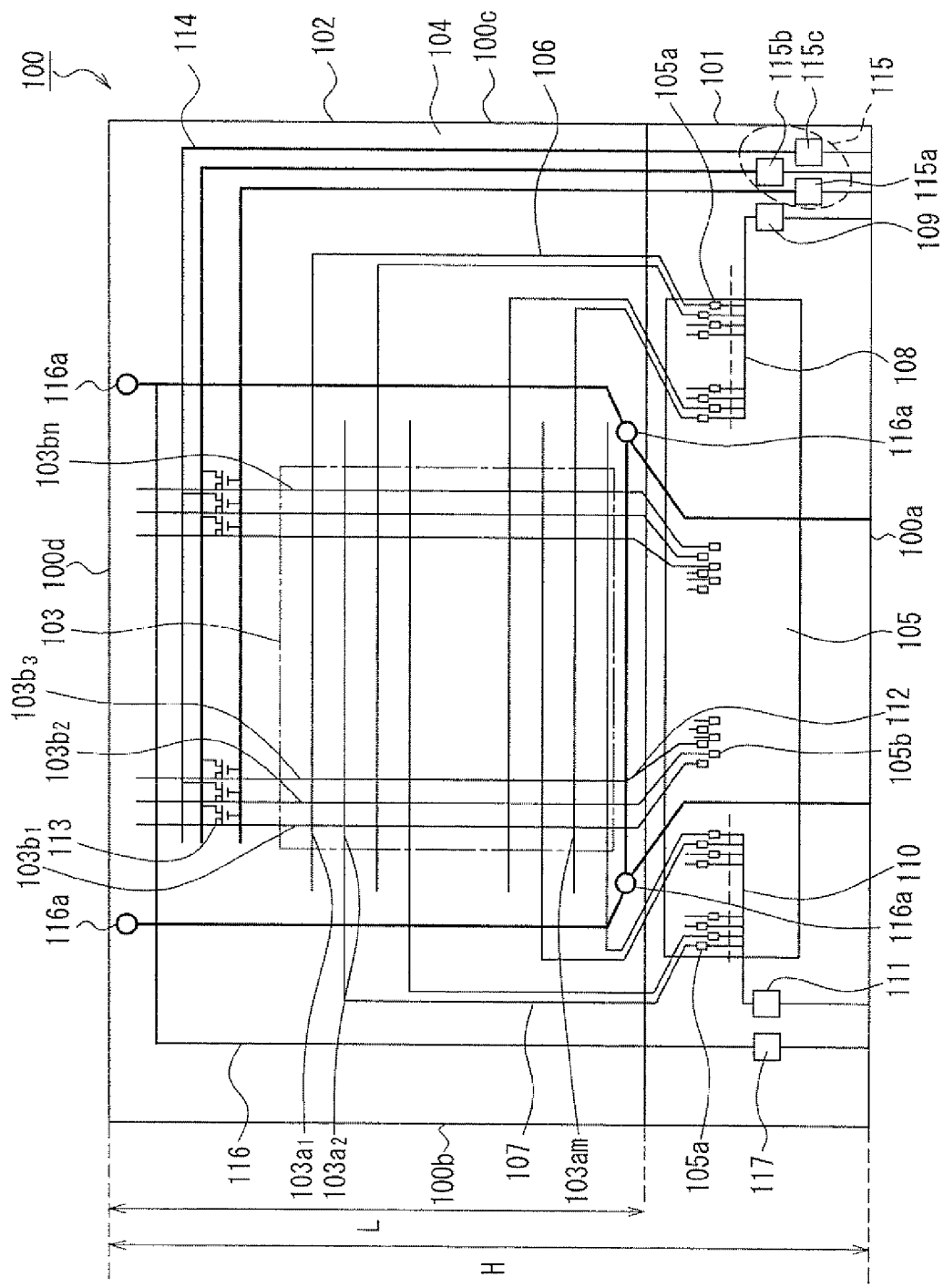
FIG. 5 is a plan view showing another conventional liquid crystal panel.

Incidentally, the source-side switching elements 41c preferably are connected with junction portions 54a of the source lead-out lines 54, as shown in FIG. 3. In other words, the junction portions 54a of the source lead-out lines 54 are formed in a mounting area 6 side (the first edge 1a side) part. This configuration allows a source inspection signal to be fed from the source line inspection pads 11 to the source lead-out lines 54, and then, to the source lines 41. Therefore, not only a break in the source lines 41, but also a break in the source lead-out lines 54, can be detected.

Next, a common inspection line 56 and a common line 57 formed in the lead-out line area 5 are described below.

The common inspection line 56 in a second edge 1b side part of the lead-out line area 5 is connected with a common electrode pad 12. The common inspection line 56 also is connected with the common line 57 formed so as to surround the display area 4. The common line 57 has transfer pads 57a. The configuration in FIG. 1 has four transfer pads 57a. The transfer pads 57a are connected with a common electrode (not shown) formed on the counter substrate 3. This allows a common voltage to be applied from the common electrode pad 12 to the common electrode formed on the counter substrate 3.

Subsequently a method for manufacturing the liquid crystal panel 1 according to the present embodiment is described below. It should be noted that hereinafter particularly the inspection step for inspecting an electrical connection state of the liquid crystal panel 1 is described in detail.

Thin films such as a conductive film, an insulation film, a protective film, and an alignment film are laminated on a transparent glass substrate, whereby a base substrate for forming active matrix substrates, on which a plurality of active matrix substrate areas to be cut out as active matrix substrates 2 are formed. Further, thin films such as a black matrix, a color filter, a conductive film, and an alignment film are laminated on a transparent glass substrate, whereby a base substrate for forming counter substrates, on which a plurality of counter substrate areas to be cut out as counter substrates 3 are formed. Over one of the base substrates, a sealing agent is applied. Then, after the application of the sealing agent, the base substrates are aligned to each other. The aligned base substrates are cut into a mother substrate in which an arbitrary number of liquid crystal panels 1 each of which has the active matrix substrate 2 and the counter substrate 3 are formed. Into each of the liquid crystal panels 1 cut out as the mother substrate, via filling ports formed between the active matrix substrate 2 and the counter substrate 3, a liquid crystal material is filled to therebetween, by, for example, the vacuum filing method. It should be noted that the liquid crystal material may be filled by the dropping filling method instead of the vacuum filling method. The liquid crystal panel 1 shown in FIG. 1 is one of liquid crystal panels in the thus cut mother substrate after the liquid crystal material was filled therein. Therefore, liquid crystal panels are formed on, for example, upper, lower, left, and right sides to the liquid crystal panel 1 shown in FIG. 1, though they are not shown in the drawing.

Then, before a driving circuit is mounted on the mounting area 6, an inspection step for inspecting an electrical connection state of the liquid crystal panel 1 is performed. The inspection step is intended to perform inspection for a break or a short circuit (leak) in the lines on the active matrix substrate 2 of the liquid crystal panel 1. Besides, the inspection step is performed through two sub-steps, which are a first inspection sub-step for inspecting a break and the like in the gate lines 40, and a second inspection sub-step for inspecting a short circuit and the like in the gate lines 40.

The following inspection method is performed. In the first inspection sub-step, for example, a probe for inspection is brought into contact with the upper gate line inspection pad 7 for the first inspection, the lower gate line inspection pad 8 for the first inspection, the source line Inspection pads 11, and the common electrode pad 12, so that a voltage is applied thereto. In the second inspection sub-step, for example, a probe for inspection is brought into contact with the upper gate line inspection pads 9 for the second inspection, the lower gate line inspection pads 10 for the second inspection, the source line inspection pads 11, and the common electrode pad 12, so that a voltage is applied thereto. With this, a gate inspection signal serving as a scanning signal is fed to the gate lines 40. Further, a source inspection signal serving as pixel data is fed to the source lines 41. Thereby the orientation directions of liquid crystal molecules are controlled, and when, for example, the liquid crystal panel 1 is irradiated from the back side with an illumination means such as a backlight, the display area 4 of the liquid crystal panel 1 displays an image. Therefore, a break or a short circuit of lines of the active matrix substrate 2 of the liquid crystal panel 1 can be inspected by, for example, an inspector's visual observation, on the display area 4 of the liquid crystal panel 1. It should be noted that the inspection may be performed by using an inspection device or the like, instead of or in addition to the inspector's visual observation.

Here, the first inspection sub-step is described below in detail.

The following first describes the method for inspecting a break in the gate lines 40 and the gate lead-out lines 50 and 51.

A gate inspection signal is fed from the gate line inspection pads 7 and 8 for the first inspection to the gate lines 40 and the gate lead-out lines 50 and 51. Therefore, when there is a break in any of the gate lines 40, in the display area 4 of the liquid crystal panel 1, pixels ahead of the foregoing break in the gate line 40 are not displayed. Thus, the break in the gate line 40 can be detected. Further, when there is a break in the gate lead-out line 50 or 51, in the display area 4 of the liquid crystal panel 1, all the pixels corresponding to the gate line 40 connected with the gate lead-out line 50 or 51 having the break are not displayed. Thus, the break in the gate lead-out line 50 or 51 can be detected.

Incidentally, the foregoing describes a case where a gate inspection signal is fed via the gate line inspection pads 7 and 8 for the first inspection to the gate lines 40 and the gate lead-out lines 50 and 51 at once. In other words, the same gate inspection signal is fed to each of the adjacent gate lines 40. Therefore, the adjacent gate lines 40 have the same potential. As a result, in the first inspection sub-step in which the gate inspection signal is fed via the gate line inspection pads 7 and 8 for the first inspection to the gate lines 40 and the gate lead-out lines 50 and 51 at once, it is impossible to detect any short circuit in the gate lines 40 and the gate lead-out lines 50 and 51. Therefore, in the second inspection sub-step described later, the presence/absence of a short circuit in the gate lines 40 and the gate lead-out lines 50 and 51 is inspected.

Next, a method for inspecting any break in the source lines 41 and the source lead-out lines 54 is described below.

A source inspection signal is fed via the source line inspection pads 11 to the source lines 41 and the source lead-out lines 54. Therefore, when there is a break in any of the source lines 41, in the display area 4 of the liquid crystal panel 1, pixels ahead of the foregoing break in the source line 41 are not displayed. Thus, the break in the source lines 41 can be detected.

In the case of the example shown in FIG. 1, however, when there is a break in any of the source lead-out lines 54, the break in the source lead-out line 54 cannot be detected on the display area 4 of the liquid crystal panel 1. This is because the source inspection signal is fed from the source line inspection pads 11 via the source lines 41 to the source lead-out lines 54. Therefore, it is preferable that the source-side switching elements 41c are connected with the junction portions 54a of the source lead-out lines 54, as shown in FIG. 3. With this configuration, the source inspection signal is fed from the source line inspection pads 11 via the source lead-out lines 54 to the source lines 41. Therefore, when there is a break in any of the source lead-out lines 54, in the display area 4 of the liquid crystal panel 1, all the pixels corresponding to the source line 41 connected with the source lead-out line 54 having the foregoing break are not displayed. Thus, not only a break in the source lines 41, but also a break in the source lead-out lines 54, can be detected.

Next, a method for detecting a short circuit in the source lines 41 and the source lead-out lines 54 is described below.

A control signal for turning on the source-side switching elements 41c is fed to the source-side switching elements 41c via the switching pad 11a of the source line inspection pads 11. By so doing, the source-side switching elements 41c are turned on. Then, a source inspection signal is fed to the odd-numbered source lines $41_1, 41_3, \ldots 41_{n-1}$ via the inspection pad 11b. A source inspection signal also is fed to the even-numbered source lines $41_2, 41_4, \ldots 41_n$ via the inspection pad 11c. Here, for example, the input of the source inspection signal to the even-numbered source lines $41_2, 41_4, \ldots 41_n$ is omitted and the source inspection signal is fed only to the odd-numbered source lines $41_1, 41_3, \ldots 41_{n-1}$. By so doing, if any of the source lines 41 and the source lead-out lines 54 has a short circuit with an adjacent line, not only the pixels corresponding to the odd-numbered source lines 41, but also the pixels corresponding to the foregoing even-numbered source line 41 having the short circuit are displayed in the display area 4 of the liquid crystal panel 1. Therefore, a short circuit in the source lines 41 and the source lead-out lines 54 can be detected.

As described above, any short circuit of the gate lines 41 and the gate lead-out lines 50 and 51 cannot be detected by the first inspection sub-step. Therefore, to inspect the presence/absence of any short circuit in the gate lines 40 and the gate lead-out lines 50 and 51, the second inspection sub-step is performed subsequently.

Here, prior to the second inspection sub-step, a step of breaking the extension lines 70a and 80a is performed. Specifically, the extension lines 70a and 80a are cut, for example, along a cutting line C shown in FIG. 1. As a cutting method, for example, a laser-using cutting method is employed. This causes the plurality of gate terminals 6a connected with the upper gate lead-out lines 50 and the lower gate lead-out lines 51 are cut from one another electrically. It should be noted that the cutting may be carried out along any other cutting line, instead of the cutting line C, as long as the plurality of gate terminals 6a are cut from one another electrically.

Next, the second inspection sub-step is described in detail.

The following describes a method for detecting a short circuit in the gate lines 40 and the gate lead-out lines 50 and 51.

A control signal for turning on the upper gate-side switching elements 40c is fed to the upper gate-side switching elements 40c via the switching pad 9a of the upper gate line inspection pads 9 for the second inspection. Thereby the upper gate-side switching elements 40c are turned on. Then, a gate inspection signal is fed to the odd-numbered upper gate lines $40_1, 40_3, \ldots$ via the inspection pad 9b. A gate inspection signal is fed to the even-numbered upper gate lines $40_2, 40_4, \ldots$ via the inspection pad 9c. Here, for example, the input of the gate inspection signal to the even-numbered upper gate lines $40_2, 40_4, \ldots$ is omitted, and the gate inspection signal is fed only to the odd-numbered upper gate lines $40_1$, $40_3$, . . . . Here, if any of the upper gate lines 40 or the upper gate lead-out lines 50 has a short circuit with an adjacent line, in the display area 4 of the liquid crystal panel 1, not only the pixels corresponding to the odd-numbered upper gate lines 40, but also the pixels corresponding to the even-numbered upper gate line 40 having the foregoing short circuit are displayed. Thus, a short circuit of the upper gate lines 40 and the upper gate lead-out lines 50 can be detected.

A control signal for turning on the lower gate-side switching elements 40c' is fed to the lower gate-side switching elements 40c' via the switching pad 10a of the lower gate line inspection pads 10 for the second inspection. Thereby the lower gate-side switching elements 40c' are turned on. Then, a gate inspection signal is fed to the odd-numbered lower gate lines $40_{m-1}$, $40_{m-3}$, . . . via the inspection pad 10b. A gate inspection signal is fed to the even-numbered lower gate lines $40_m$, $40_{m-2}$, . . . via the inspection pad 10b. Further, a gate inspection signal is fed to the even-numbered lower gate lines 40 and the even-numbered lower gate lead-out lines 51 via the inspection pad 10c. Here, for example, the input of the gate inspection signal to the even-numbered lower gate lines $40_m$, $40_{m-2}$, . . . is omitted, and the gate inspection signal is fed only to the odd-numbered lower gate lines $40_{m-1}$, $40_{m-3}$, . . . . Here, if any of the lower gate lines 40 or the lower gate lead-out lines 51 has a short circuit with an adjacent line, not only the pixels corresponding to the odd-numbered lower gate lines 40, but also the pixels corresponding to the even-numbered lower gate line 40 having the foregoing short circuit are displayed in the display area 4 of the liquid crystal panel 1. Thus, a short circuit of the lower gate lines 40 and the lower gate lead-out lines 51 can be detected.

Here, in the second inspection sub-step, a gate inspection signal is fed to the gate lines 40 via the gate line inspection pads 9 and 10 for the second inspection. This also allows any break in the gate lines 40 to be detected in the second inspection sub-step. Therefore, the inspection of the gate lines 40 for a break may be performed in the second inspection sub-step, instead of or in addition to the inspection in the first inspection sub-step. It should be noted that any break in the gate lead-out lines 50 and 51 cannot be detected in the second inspection sub-step. Therefore, the inspection of the gate lead-out lines 50 and 51 for a break has to be performed in the first inspection sub-step.

In the second inspection sub-step also, a source inspection signal is fed to the source lines 41 and the source lead-out lines 54 via the source inspection pads 11. Therefore, in the second inspection sub-step also, any break in the source lines 41 and any short circuit in the source lines 41 and the source lead-out lines 54 can be detected. Therefore, the inspection of the source lines 41 for a break and the inspection of the source lines 41 and the source lead-out lines 54 for a short circuit may be performed in the second inspection sub-step, instead of or in addition to the inspection in the first inspection sub-step.

Incidentally, in the above-described cutting step, when the line-break-inspection lines 70 and 80 for the gate lines are cut, a part of the line-break-inspection lines 70 and 80 for the gate lines is not removed and remains in some cases. Further, cuttings flying over the mounting area 6 could cause a short circuit to the gate terminals 6b or the gate lead-out lines 50 and 51 in some cases. Therefore, whether or not the gate terminals 6a connected with the gate lead-out lines 50 and 51 are cut electrically from one another is inspected preferably. More specifically, a gate inspection signal is fed to the line-break-inspection lines 70 and 80 for the gate lines via the gate line inspection pads 7 and 8 for the first inspection. As a result, if a part of the line-break-inspection lines 70 and 80 for the gate lines is not removed and remains or the gate terminals 6b or the gate lead-out lines 50 and 51 have a short circuit, the display area 4 of the liquid crystal panel 1 displays the same. Thus, an inconvenience occurring in the above-described cutting step can be detected.

In the first inspection sub-step or the second inspection sub-step, when a break or a short circuit is detected in the gate lines 40 or the source lines 41, the liquid crystal panel 1 in which such a break or a short circuit is detected is weeded out as a defective item. By so doing, the yield of the liquid crystal panel 1 can be improved. It should be noted that a liquid crystal panel 1 in which a break or a short circuit is detected may not be weeded out, but the break or the short circuit may be repaired by irradiating the portion of line break of the short circuit with laser or the like.

Then, after the above-described inspection sub-steps (the first and second inspection sub-steps), a mounting step is performed. The mounting step is intended to mount a driving circuit for driving and controlling the gate lines 40 and the source lines 41 in, for example, the mounting area 6 of the active matrix substrate 2. Then, individual liquid crystal panels 1 are cut out of the mother substrate. Onto the liquid crystal panel 1 thus cut out, an optical film such as a polarization plate is applied. Thereby the liquid crystal panel 1 is manufactured. It should be noted that the method for manufacturing the liquid crystal panel 1 is not limited to the above-described method. For example, a color filter does not have to be provided on a counter substrate in the case where a monochrome liquid crystal panel is manufactured. The inspection step and the mounting step may be performed after the individual liquid crystal panels are cut out.

As described above, according to the active matrix substrate 2 in the present embodiment, in the inspection step in the manufacturing process or the like, a gate inspection signal can be fed to the upper gate lines 40 and the upper gate lead-out lines 50 via the upper gate-side switching elements 40c by maintaining the upper gate-side switching elements 40c in an ON state (conductive state) with use of an ON/OFF control signal while feeding independent gate inspection signals to the upper first gate lead inspection line 52b and the upper second gate lead inspection line 52c, respectively. It should be noted that the upper first gate lead inspection line 52b allows a gate inspection signal to be fed to, among the upper gate-side switching elements 40c connected with the upper gate lines 40, those which are not adjacent to one another. Further, the upper second gate lead inspection line 52c is connected with, among the upper gate-side switching elements 40c connected with the upper gate lines 40, those which are not connected with the upper first gate lead inspection line 52b and are not adjacent to one another, and hence, allows a gate inspection signal to be fed to those upper gate-side switching elements 40c. Therefore, gate inspection signals independent from each other can be fed to adjacent ones of the upper gate lines 40 and adjacent ones of the gate lead-out lines 50. Thereby any short circuit (leak) between adjacent ones of the upper gate lines 40 and any short circuit between adjacent ones of the gate lead-out lines 50 can be detected. In the same manner, gate inspection signals that are independent from each other may be fed to the lower first gate lead inspection line 53b and the lower second gate lead inspection line 53c, respectively, while the lower gate-side switching elements 40c' are maintained in an ON state (conductive state) with use of an ON/OFF control signal. Thereby any short circuit between adjacent ones of the lower gate lines 40 and a short circuit between adjacent ones of the lower gate lead-out lines 51 can be detected. Further, in the same manner as described above, source inspection signals that are independent from each other may be fed to the first source lead inspection line 55b and the second source lead inspection line 55c, respectively while the source-side switching elements 41c are maintained in an ON state (conductive state) with use of an ON/OFF control signal. Thereby any short circuit between adjacent ones of the source lines 41 and any short circuit between adjacent ones of the source lead-out lines 54 can be detected. Consequently, it is possible to achieve an active matrix substrate having a simple configuration that allows a short circuit in lines to be detected surely and allows inspection errors to decrease.

It should be noted that the above description of the present embodiment explains an example in which a common voltage is applied to a common electrode of the counter substrate, but needless to say, the present invention is applicable to, for example, a liquid crystal panel of an IPS (In-Plane Switching) mode in which a common electrode is disposed on an active matrix substrate. It is unnecessary to form transfer pads on the active matrix substrate of the liquid crystal panel of the IPS mode. Furthermore, needless to say, the present invention also is applicable widely to a liquid crystal panel of a MVA (Multi-domain Vertical Aligned) mode, a liquid crystal panel of an OCB (Optically Compensated Bend) mode, and the like.

The above description of the present embodiment explains an example in which each inspection pad is formed on an active matrix substrate, but the present invention is not limited to this. More specifically, for example, each inspection pad may be formed on a substrate for inspection, and only lines for inspection to which an inspection signal supplied from each inspection pad can be fed may be formed on the active matrix substrate.

Further, as the present embodiment, an example is described in which different inspection signals are fed to the odd-numbered ones and the even-numbered ones of the gate lines and the source lines, respectively, but the present invention is not limited to this example. For example, different inspection signals may be fed to R (red), G (green), and B (blue) of the source lines, respectively. Alternatively, a plurality of types of inspection signals may be fed to the gate lines and the source lines. In other words, any configuration is acceptable as long as different inspection signals should be fed to adjacent ones of the gate lines, respectively, and different inspection signals should be fed to adjacent ones of the source lines, respectively.

The present invention is not limited to the embodiment described above, and may be varied in many ways in the scope indicated by claims. In other words, embodiments obtained by combining technical means appropriately modified in the scope indicated by claims also fall in the technical scope of the present invention.

INDUSTRIAL APPLICABILITY

As described above, the present invention is useful as an active matrix substrate having a simple configuration that allows a short circuit of lines thereon to be detected surely and allows inspection errors to decrease, as a display device having such an active matrix substrate, and as a method for inspecting such an active matrix substrate.

The invention claimed is:

1. An active matrix substrate, comprising:
a plurality of first lines formed parallel with one another in a display area;
a plurality of second lines formed parallel with one another so as to cross the first lines in the display area; and
a plurality of terminals formed in a mounting area,
wherein the plurality of first lines, having first ends on one side and second ends on the other side, include a first group of the first lines that are adjacent to one another and whose first ends serve as input ends for a driving signal, and a second group of the first lines that are adjacent to one another and whose second ends serve as input ends for a driving signal,
the active matrix substrate further comprising:
a first lead-out line that connects the first ends of the first lines of the first group with the terminals;
a second lead-out line that connects the second ends of the first lines of the second group with the terminals;
first switching elements connected with the second ends of the first lines of the first group;
second switching elements connected with the first ends of the first lines of the second group;
a third lead-out line that connects the first ends of the second lines with the terminals;
third switching elements connected with the second lines or the third lead-out line;
a first switching element control line through which an ON/OFF control signal can be fed to the first switching elements;
a second switching element control line through which an ON/OFF control signal can be fed to the second switching elements; and
a third switching element control line through which an ON/OFF control signal can be fed to the third switching elements;
a first inspection line through which an inspection signal can be fed to the first switching elements that are not adjacent to one another, among the first switching elements connected with the first lines of the first group;
a second inspection line connected with the first switching elements that are not connected with the first inspection line and are not adjacent to one another, among the first switching elements connected with the first lines of the first group, so that an inspection signal can be fed to said first switching elements;
a third inspection line through which an inspection signal can be fed to the second switching elements that are not adjacent to one another, among the second switching elements connected with the first lines of the second group;
a fourth inspection line connected with the second switching elements that are not connected with the third inspection line and are not adjacent to one another, among the second switching elements connected with the first lines of the second group, so that an inspection signal can be fed to said second switching elements;
a fifth inspection line through which an inspection signal can be fed to the third switching elements that are not adjacent to one another, among the third switching elements connected with the second lines; and
a sixth inspection line connected with the third switching elements that are not connected with the fifth inspection line and are not adjacent to one another, among the third switching elements connected with the second lines, so that an inspection signal can be fed to said third switching elements.

2. The active matrix substrate according to claim 1, wherein
the first lines of the first group are provided farther to the mounting area, as compared with the first lines of the second group, and the second switching element control line, the third inspection line, and the fourth inspection line are provided closer to the display area, as compared with the first lead-out line.

3. The active matrix substrate according to claim 2, further comprising:
   first extension lines that are extended individually from the plurality of terminals connected with the first lead-out line;
   a first line-break-inspection line to which each of the first extension lines is connected and through which an inspection signal can be fed;
   second extension lines that are extended individually from the plurality of terminals connected with the second lead-out line; and
   a second line-break-inspection line to which each of the second extension lines is connected and through which an inspection signal can be fed.

4. A method for inspecting the active matrix substrate according to claim 3, comprising the steps of:
   inspecting the first lines of the first group by feeding an inspection signal thereto through the first line-break-inspection line;
   inspecting the first lines of the second group by feeding an inspection signal thereto through the second line-break-inspection line;
   cutting the first extension lines and the second extension lines;
   inspecting the first lines of the first group and the first lead-out line by feeding inspection signals independent from each other to the first inspection line and the second inspection line, respectively, while maintaining the first switching elements in an ON state;
   inspecting the first lines of the second group and the second lead-out line by feeding inspection signals independent from each other to the third inspection line and the fourth inspection line, respectively, while maintaining the second switching elements in an ON state;
   and inspecting the second lines by feeding inspection signals independent from each other to the fifth inspection line and the sixth inspection line, respectively, while maintaining the third switching elements in an ON state.

5. The active matrix substrate according to claim 1, wherein the third switching elements are connected with the third lead-out line.

6. The active matrix substrate according to claim 1, wherein the first lines are gate lines, and the second lines are source lines.

7. A display device comprising the active matrix substrate according to claim 1.

8. The display device according to claim 7, wherein the display device is a liquid crystal display device.

* * * * *